(12) United States Patent
Fast et al.

(10) Patent No.: US 11,894,619 B2
(45) Date of Patent: Feb. 6, 2024

(54) PASSIVE VECTOR MODULATOR

(71) Applicant: Raytheon Company, Waltham, MA (US)

(72) Inventors: Bryan Fast, El Segundo, CA (US); Wesley S. Pan, El Segundo, CA (US); Peter Song, Del Mar, CA (US)

(73) Assignee: RAYTHEON COMPANY, Waltham, MA (US)

( * ) Notice: Subject to any disclaimer, the term of this patent is extended or adjusted under 35 U.S.C. 154(b) by 446 days.

(21) Appl. No.: 17/351,289

(22) Filed: Jul. 23, 2021

(65) Prior Publication Data
US 2023/0028558 A1    Jan. 26, 2023

(51) Int. Cl.
*H01Q 3/38* (2006.01)
*H03H 7/18* (2006.01)
*H04L 27/36* (2006.01)
*H03H 17/08* (2006.01)

(52) U.S. Cl.
CPC .............. *H01Q 3/38* (2013.01); *H03H 7/185* (2013.01); *H04L 27/362* (2013.01); *H03H 17/08* (2013.01)

(58) Field of Classification Search
None
See application file for complete search history.

(56) References Cited

U.S. PATENT DOCUMENTS

| | | | |
|---|---|---|---|
| 6,894,657 B2 | 5/2005 | Carey | |
| 8,416,882 B2 | 4/2013 | Corman et al. | |
| 10,700,766 B2 * | 6/2020 | Khandani | H04B 7/15557 |
| 11,627,024 B2 * | 4/2023 | Ning | H03K 5/01 327/254 |
| 2020/0350679 A1 * | 11/2020 | Yu | H01P 1/18 |

* cited by examiner

*Primary Examiner* — Cassandra F Cox
(74) *Attorney, Agent, or Firm* — Burns & Levinson, LLP; Joseph M. Maraia

(57) ABSTRACT

A passive vector modulator (PVM) includes a divider that splits an input signal into a first divided signal and a second divided signal 90° apart in phase. The PVM includes a switched transformer phase shifter including primary windings to form first primary windings and second primary windings receiving the first divided signal and the second divided signal respectively. First secondary windings are coupled to the first primary windings, the first secondary windings being center-tapped and outputting first and second phase shifted output signals, phase shifted 180° and 0° respectively. Second secondary windings are coupled to the second primary windings, the second secondary windings being center-tapped and outputting third and fourth phase shifted signals, phase shifted 270° and 90° respectively. The PVM includes a switch configured to receive the phase shifted output signals. The switch selectively outputs one of the phase shifted output signals, or a combination, from the PVM.

20 Claims, 11 Drawing Sheets

| Control Signal (V) | Phase State (°) | | | | | | | |
|---|---|---|---|---|---|---|---|---|
| | 0 | 45 | 90 | 135 | 180 | 225 | 270 | 315 |
| ps180 | 0 | 0 | 0 | Von | Von | Von | 0 | 0 |
| ps0 | Von | Von | 0 | 0 | 0 | 0 | 0 | Von |
| ps270 | 0 | 0 | 0 | 0 | 0 | Von | Von | Von |
| ps90 | 0 | Von | Von | Von | 0 | 0 | 0 | 0 |
| Vrev | Vrev | Vrev | Vrev | Vrev | Vrev | Vrev | Vrev | Vrev |

FIG. 4

PASSIVE VECTOR MODULATOR

TECHNICAL FIELD

The subject disclosure relates to vector modulators, specifically passive vector modulators with switched transformers.

BACKGROUND

Phase shifters are network modules utilized in high radio frequency (RF) network designs that provide a controllable phase shift of an input signal by changing a transmission phase angle of the input signal. A phase shift may be defined as the difference in phase angle, or the shift between AC current and voltage on a measured impedance, between an input signal at a given frequency and an output signal at the same frequency. The selection of modules and control elements within a phase shifter network depends on an application's required bandwidth, insertion loss, switching speed, power handling, linearity, accuracy and resolution. Ideally, phase shifters provide an output signal with an equal amplitude to the input signal, where any loss is attributed to the insertion loss of the module.

Vector modulators can be used to perform a phase shift function with the added benefit of amplitude control. Vector modulators are capable of simultaneous amplitude and phase control of an output signal using an RF or microwave circuit. In this regard, a sinusoidal input signal can be expressed as a vector having the properties of both amplitude and phase with respect to a reference signal, such as a vector in a polar coordinate system with coordinates of amplitude and phase. A traditional vector modulator circuit may also include a divider which splits an input signal into two or more paths, an amplitude and/or phase control element in each path, and an output signal in-phase combiner. Passive circuit vector modulators avoid the use of amplifiers as opposed to active circuit vector modulators.

In a typical phased array antenna system, vector modulators are employed to vary both the amplitude and phase of a signal, as opposed to merely varying the phase with a phase shifter to optimize antenna patterns. As such, in a simple array antenna, the RF current from a transmitter is fed to the individual antennas with the correct phase relationship and with amplitude control so that radio waves from the separate antennas add together to increase the radiation in a desired direction and cancel to suppress radiation in undesired directions.

High frequency phase shifter circuits are challenged by associated high switch energy losses at respective frequencies. Vector modulators can similarly perform phase shifting functions but are frequently implemented with active circuits that struggle with power consumption and linearity. Therefore, there is a need for a passive vector modulator capable of low loss switched transformer phase shifting functions.

SUMMARY OF THE TECHNOLOGY

In at least one aspect, this application describes an exemplary use of a passive vector modulator to split a signal into four different phases such that they can be recombined at various magnitudes to create a desired phase shift. This application uses a low loss switched transformer phase shifter capable of a 180° phase shift of a signal. The switched transformer phase shifter also is capable of an impedance transformation to enable a 4 pole multiple throw switch to complete a passive vector modulator.

An example passive vector modulator includes a power divider that splits an input signal into a first divided signal and a second divided signal. The first divided signal and second divided signal are 90° apart in phase. The passive vector modulator includes a switched transformer phase shifter in electrical communication with the power divider. The switched transformer phase shifter includes primary windings being center-tapped to form first primary windings and second primary windings. The first primary windings receive the first divided signal and the second primary windings receive the second divided signal. The switched transformer phase shifter includes first secondary windings inductively coupled to the first primary windings. The first secondary windings are center-tapped and output first and second phase shifted output signals. The first phase shifted output signal is phase shifted 180° and the second phase shifted output signal is phase shifted 0°. The switched transformer phase shifter includes second secondary windings inductively coupled to the second primary windings. The second secondary windings are center-tapped and output third and fourth phase shifted signals. The third phase shifted output signal is phase shifted 270° and the fourth phase shifted output signal is phase shifted 90°. The switched transformer phase shifter includes a switch configured to receive the first, second, third, and fourth phase shifted output signals. The switch, in response to a control signal, selectively outputs one of the first, second, third, and fourth phase shifted output signals, or a combination thereof, from the passive vector modulator as a vector modulated output signal.

The switched transformer phase shifter may include at least one balun transformer. The first secondary windings may form a first transformer balun and the second secondary windings form a second transformer balun. A turn ratio of about 1:0.75 may be set between the first primary windings and the first secondary windings to establish an output impedance of about 66.7 Ohms and wherein a turn ratio of about 1:0.75 may be set between the second primary windings and the second secondary windings to establish an output impedance of about 66.7 Ohms when the switch outputs one of the first, second, third, and fourth output signals. A turn ratio of X:Y may be set between the first primary windings and the first secondary windings and a turn ratio of X:Y may be set between the second primary windings and the second secondary windings, wherein X and Y are not equal. An output impedance of about 33.3 Ohms may be established when the switch outputs a combination of at least two of the first, second, third, and fourth output signals.

The power divider may include a quadrature coupler. The switched transformer phase shifter may include first attenuator and second attenuators disposed between the power divider and the first primary windings and second primary windings respectively. The switched transformer phase shifter may include a first transformer phase shifter and a second transformer phase shifter, wherein the first transformer phase shifter includes the first primary windings and first secondary windings, and the second transformer phase shifter includes the second primary windings and second secondary windings. The switch may include one or more series diodes.

An example method of modulating a signal includes splitting an input signal into a first divided signal and a second divided signal, the first divided signal and second divided signal being 90° apart in phase. The example method includes receiving the first divided signal with first primary windings of center-tapped primary windings. The example method includes receiving the second divided signal with second primary windings of the center-tapped primary windings. The example method includes transmitting first and second phase shifted output signals with first secondary windings, the first secondary windings being inductively coupled to the first primary windings, the first phase shifted output signal being phase shifted 180° and the second phase shifted output signal being phase shifted 0°. The example method includes transmitting third and fourth phase shifted output signals with second secondary windings, the second secondary windings being inductively coupled to the second primary windings, the third phase shifted output signal being phase shifted 270° and the fourth phase shifted output signal being phase shifted 90°. The example method includes selectively outputting one of the first, second, third, and fourth output signals, or a combination thereof, as a vector modulated output signal in response to a control signal with a switch configured to receive the first, second, third, and fourth phase shifted output signals.

The first secondary windings may form a first transformer balun and the second secondary windings form a second transformer balun. The example method may include setting a turn ratio of about 1:0.75 between the first primary windings and the first secondary windings to establish an output impedance of about 66.7 Ohms, and setting a turn ratio of about 1:0.75 between the second primary windings and the second secondary windings to establish an output impedance of about 66.7 Ohms when the switch outputs one of the first, second, third, and fourth output signals. The example method may include setting a turn ratio of X:Y between the first primary windings and the first secondary windings, and setting a turn ratio between the second primary windings and the second secondary windings of X:Y, wherein X and Y are not equal. An output impedance of about 33.3 Ohms may be established when the switch outputs a combination of at least two of the first, second, third, and fourth output signals.

The example method may include providing additional phase bits using a first attenuator and second attenuator disposed between the power divider and the first phase shifter and second phase shifter respectively.

The first primary windings and first secondary windings may be disposed within a first transformer phase shifter, and the second primary windings and second secondary windings may be disposed within a second transformer phase shifter. Splitting an input signal into a first divided signal and a second divided signal may be completed by a quadrature coupler. Selectively outputting one of the first, second, third, and fourth output signals may be completed by a switch.

An example transceiver includes an antenna and a passive vector modulator. The passive vector modulator includes a power divider that splits an input signal into a first divided signal and a second divided signal. The first divided signal and second divided signal are 90° apart in phase. The passive vector modulator includes a switched transformer phase shifter in electrical communication with the power divider. The switched transformer phase shifter includes primary windings being center-tapped to form first primary windings and second primary windings. The first primary windings receive the first divided signal and the second primary windings receive the second divided signal. The switched transformer phase shifter includes first secondary windings inductively coupled to the first primary windings. The first secondary windings are center-tapped and output first and second phase shifted output signals. The first phase shifted output signal is phase shifted 180° and the second phase shifted output signal is phase shifted 0°. The switched transformer phase shifter includes second secondary windings inductively coupled to the second primary windings. The second secondary windings are center-tapped and output third and fourth phase shifted signals. The third phase shifted output signal is phase shifted 270° and the fourth phase shifted output signal is phase shifted 90°. The switched transformer phase shifter includes a switch configured to receive the first, second, third, and fourth phase shifted output signals. The switch, in response to a control signal, selectively outputs one of the first, second, third, and fourth phase shifted output signals, or a combination thereof, from the passive vector modulator as a vector modulated output signal.

BRIEF DESCRIPTION OF THE DRAWINGS

FIG. 4 is a table of control signals for selectively switching the output signal phase from the 3-bit PVM of FIG. 3.

DETAILED DESCRIPTION

The subject technology addresses deficiencies associated with implementing passive vector modulators by providing higher linearity while maintaining relatively low power loss in a signal than active circuits using amplifiers. The basis of vector modulators as described herein includes splitting an input signal into four different phases (0/90/180/270°) such that they can be recombined at various magnitudes to create any phase shift desired. A quadrature coupler splits the input signal into 0/90° and incurs a 3 dB split loss. Obtaining additional 180° and 270° phases usually incurs another split loss of 3 dB, though the subject technology may employ a 180° phase shift bit to save 2 dB of that loss. Merging that phase bit with a multiple throw switch enabled by a specific impedance transformation and another 180° phase bit, a total of the four signals with greatly reduced loss may be seamlessly combined in a vector modulator configuration.

Figure 1:
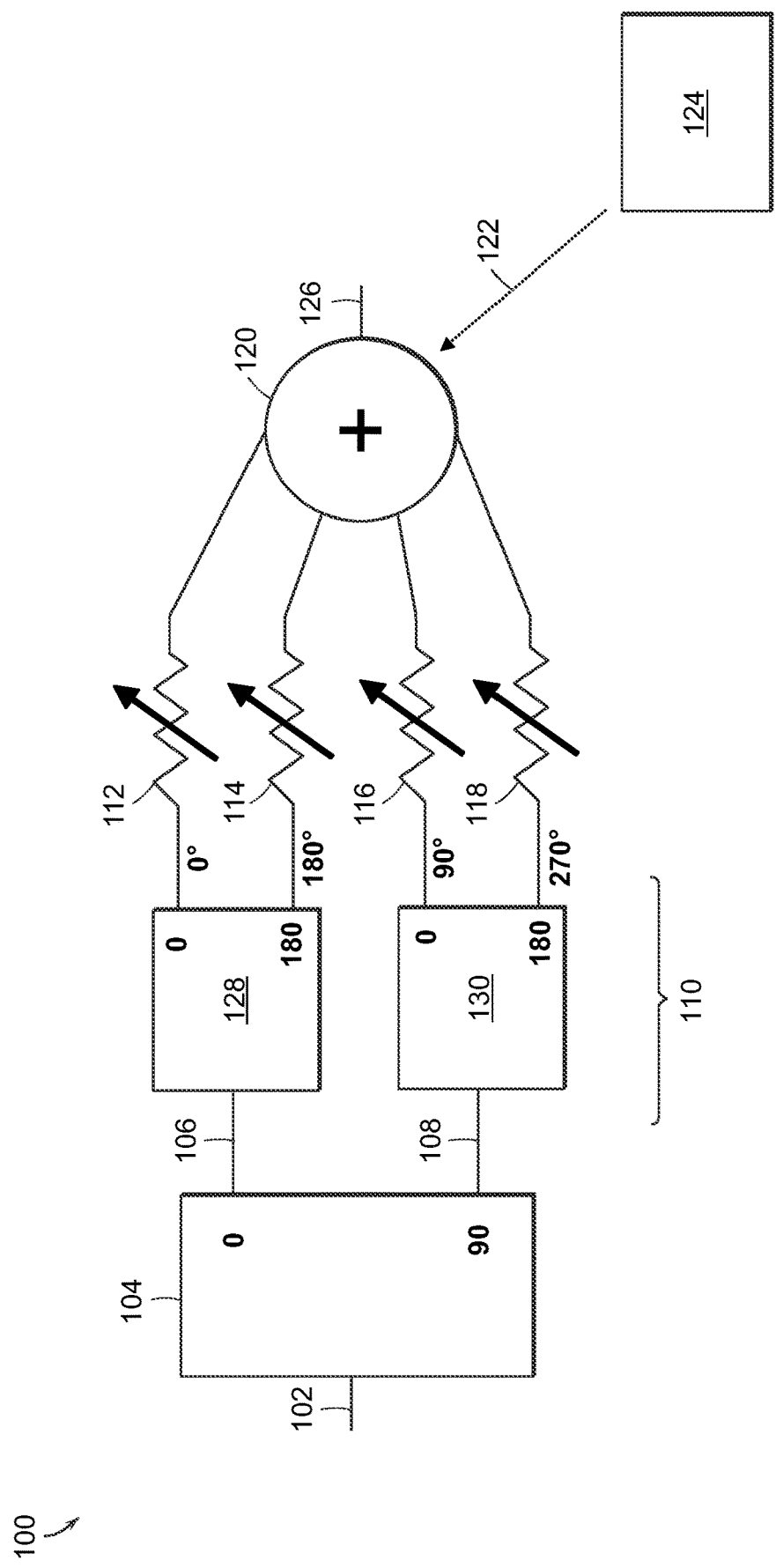
FIG. 1 is a block diagram showing a passive vector modulator (PVM).

FIG. 1 is a block diagram of a passive vector modulator (PVM) 100. The passive vector modulator may include a power divider 104. The power divider 104 includes an input port 102, a first output port 106, and a second output port 108, such that the power divider 104 is configured to receive an input signal through the input port 102 and split the input signal into two or more output signals, the output signals configured to exit the power divider 104 via the first output port 106, and the second output port 108. The power divider 104 may be configured to split (transmission) or combine (reception) signals in phase and maintain a relationship of the output signals. As such, the power divider 104 may include a splitter or combiner. The power divider 104 may include a quadrature coupler such as a branchline coupler, Lange coupler, or an overlay coupler such that the power divider 104 splits the input signal into two signals that are 90° apart in phase. In this regard, the output signals may be output in quadrature, i.e., phase shifted by 90°. The output signals may include a first divided signal and a second divided signal. The output signals may include a first divided signal with a 0° phase and a second divided signal with a 90° phase, and vice versa. It should be understood that a number of different electrical components may be used as a power divider 104 to obtain two signals that are 90° apart in phase.

A switched transformer phase shifter 110 may be included in the PVM 100 and in electrical communication with the power divider 104 such that the first output port 106 and a second output port 108 are electrically coupled to one or more input ports of the switched transformer phase shifter 110. The switched transformer phase shifter 110 may be configured to receive the first divided signal and second divided signal. The switched transformer phase shifter 110 may include a first transformer phase shifter 128 and a second transformer phase shifter 130. The first transformer phase shifter 128 may receive the first divided signal from the first output port 106, the second transformer phase shifter 130 may receive the second divided signal from the second output port 108, and vice versa.

The switched transformer phase shifter 110 may perform phase shifting functions of the first and second divided signal. In this regard, the switched transformer phase shifter 110 may output a first phase shifted output signal, a second phase shifted output signal, a third phase shifted output signal and a fourth phase shifted output. A first phase shifted output signal may be phase shifted 0° and a second phase shifted output signal may be phase shifted 180° as shown in FIG. 1. In another implementation, the first phase shifted output signal may be phase shifted 180° and the second phase shifted output signal may be phase shifted 0°. In the same regard, the third phase shifted output signal may be phase shifted 90° and the fourth phase shifted output signal may be phase shifted 270° as shown in FIG. 1. In another implementation, the third phase shifted output signal may be phase shifted 270° and the fourth phase shifted output signal may be phase shifted 90°.

The PVM 100 may include one or more resistors 112, 114, 116, 118 or passive electrical components to create resistance in the flow of electric current, specifically the first phase shifted output signal, second phase shifted output signal, third phase shifted output signal, or fourth phase shifted output signal. Resistors 112, 114, 116, and 118 may be included to delimit electric current, divide a voltage, generate heat, match or load circuits, control a gain, and fix time constants of the first phase shifted output signal, second phase shifted output signal, third phase shifted output signal, or fourth phase shifted output signal. Resistors 112, 114, 116, and 118 may include a variable resistor such that an electrical resistance value can be adjusted.

The resistors 112, 114, 116, 118 may each include a variable attenuator. Attenuators may be included in PVM 100 to reduces the power of a signal traveling therethrough without appreciably distorting its waveform. As such, an attenuator may add a calibrated amount of signal loss to properly match transmitter or receiver levels disposed upstream or downstream of the PVM 100. Attenuators may be required to provide additional phase bits to a signal at the cost of energy loss, but not significant circuitry area.

The PVM 100 may include a switch 120 in electrical communication with resistors 112, 114, 116, and 118, or in the implementations where resistors 112, 114, 116, and 118 are omitted, in electrical communication with the switch transformer phase shifter 110. The switch 120 is configured to receive the first phase shifted output signal, second phase shifted output signal, third phase shifted output signal, and fourth phase shifted output signal. As such, the switch 120 may be in electrical communication with the switched transformer phase shifter 110. In response to a control signal 122 from a controller 124, the switch 120 may output one of the first phase shifted output signal, second phase shifted output signal, third phase shifted output signal, and fourth phase shifted output signal as a vector modulated output signal 126. In response to a control signal 122 from a controller 124, the switch 120 may also output a combination of the first phase shifted output signal, second phase shifted output signal, third phase shifted output signal, and fourth phase shifted output signal as a vector modulated output signal 126.

Figure 2:
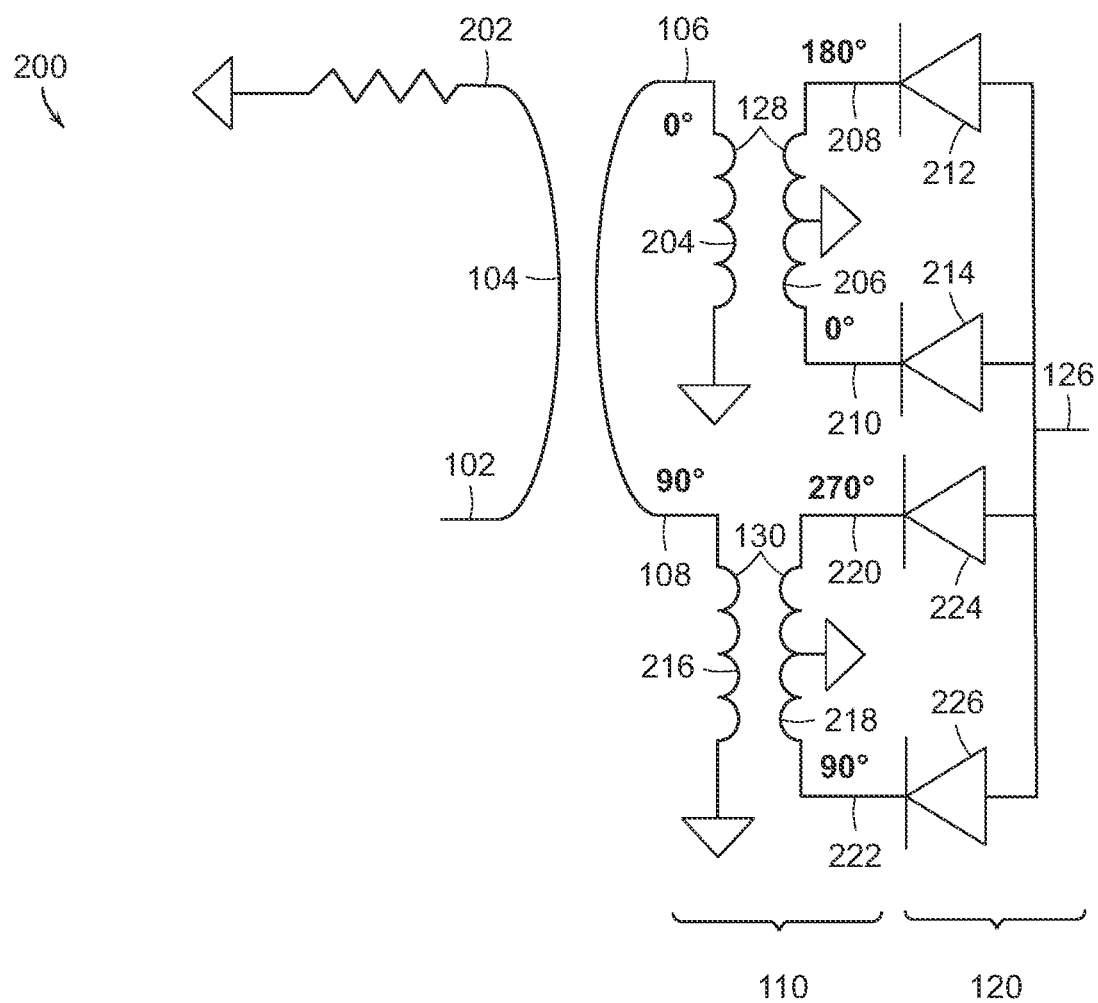
FIG. 2 is a simplified schematic diagram of a PVM.

Referring now to FIG. 2, a simplified schematic diagram of a PVM 200 is shown. The PVM 200 may receive an input signal through a first leg of the power divider 104 serving as an input port 102. The power divider 104 as shown in FIG. 2 may include a quadrature coupler as mentioned prior. As such, the power divider 104 may include four different ports, including the input port 102, a first output port 106, a second output port 108, and an isolated port 202. The power divider 104 may split the input signal equally between the first output port 106 and second output port 108. The first divided signal may travel through the first output port 106 and the second divided signal may travel through the second output port 108 with a 90° phase difference between them. The power divider may incur a 3 dB split loss.

The first output port 106 and second output port 108 of the power divider 104 may be in electrical communication with a switched transformer phase shifter 110. The switched transformer phase shifter 110 may include a single transformer phase shifter in electrical communication with the first output port 106 and second output port 108, with primary and secondary windings disposed within. In another implementation, the switched transformer phase shifter 110 may include two transformers wherein a first transformer phase shifter 128 is in electrical communication with the first output port 106 and a second transformer phase shifter 130 is in electrical communication with the second output port 108.

The switched transformer phase shifter 110 may include primary windings being center-tapped to form first primary windings 204 and second primary windings 216. The first primary windings 204 may be coupled or electrically connected to the first output port 106 whereas the second primary windings 216 may be coupled or electrically connected to the second output port 108. In some implementations where the switched transformer phase shifter 110 includes two transformers, the first primary windings 204 and second primary windings 216 may be included in separate transformers. For example, the first primary windings 204 may be disposed within the first transformer phase shifter 128 and the second primary windings 216 may be disposed within the second transformer phase shifter 128.

The switched transformer phase shifter 110 may include secondary windings being center-tapped to form first secondary windings 206 and second secondary windings 218. In some implementations where the switched transformer phase shifter 110 includes two transformers, the first secondary windings 206 and second secondary windings 218 may be included in separate transformers. For example, the first secondary windings 206 may be disposed within the first transformer phase shifter 128 and the second secondary windings 218 may be disposed within the second transformer phase shifter 128.

In some implementations, the first primary windings 204 and second primary windings 216 may receive a first and second divided signal respectively from the power divider 104. The first primary windings 204 and first secondary windings 206 may be formed around a transformer core. Similarly, the second primary windings 216 and second secondary windings 218 may be formed around the transformer core or a separate transformer core. The first primary windings 204 and second primary windings 216 may convert or transform the first or second divided signal into a magnetic field. The first secondary windings 206 may be inductively coupled to the first primary windings 204 such that the first secondary windings 206 are disposed on an opposite side of a transformer core as the first primary windings 204 within the switched transformer phase shifter 110. Similarly, the second secondary windings 218 may be inductively coupled to the second primary windings 216 such that the second secondary windings 218 are disposed on an opposite side of a transformer core as the second primary windings 216 within the switched transformer phase shifter 110. Coil windings of the first primary windings 204 may not be electrically connected to coil windings of the first secondary windings 206, but they may be linked magnetically. Coil windings of the second primary windings 216 may not be electrically connected to coil windings of the second secondary windings 218, but they may be linked magnetically.

The switched transformer phase shifter 110 may include an impedance transformer. In this regard, the switched transformer phase shifter 110 may include a ratio between the number of turns of the first primary windings 204 around the transformer core divided by the number of turns of the first secondary windings 206. Similarly, the switched transformer phase shifter 110 may include a ratio between the number of turns around the same or a different transformer core of the second primary windings 216 divided by the number of turns of the second secondary windings 218. This ratio, called the ratio of transformation, or a transformer "turns ratio". The turns ratio value dictates the operation of the transformer and the corresponding voltage available on the first secondary windings 206 or second secondary windings 218.

In this regard, the first primary windings 204 and second primary windings 204 may induce magnetic lines of flux to flow around one or more transformer cores, where the magnetic lines of flux pass through the turns of the first secondary winding 206 and second secondary winding 218, causing a voltage to be induced into the first secondary winding 206 and second secondary winding 218. The voltage induced is based on Faraday's law, dependent on the turn ratio.

The first secondary windings 206 may form a first transformer balun and the second secondary windings 218 may form a second transformer balun. The first or second transformer balun may isolate a balanced from an unbalanced system, such as an input and an output of the switched transformer phase shifter 110, or vice versa.

The first secondary windings 206 may be center-tapped. In this regard, the first secondary windings 206 may form a first secondary windings output port 208 and a second secondary windings output port 210. The second secondary windings 218 may be center-tapped. In this regard, the second secondary windings 218 may form a first third secondary windings output port 220 and a fourth secondary windings output port 222.

In operation, the input signal may be split by the power divider 104 into a first divided signal and a second divided signal that are 90° apart in phase. The first primary windings 204 may thereafter receive the first divided signal from the first output port 106 and inductively transmit the first divided signal to the first secondary windings 206. The first secondary windings 206 may output a first phase shifted output signal and a second phase shifted output signal through the first secondary windings output port 208 and the second secondary windings output port 210 respectively. The first phase shifted output signal may be phase shifted 180° and the second phase shifted output signal may be phase shifted 0°. In another implementation, the first phase shifted output signal may be phase shifted 0° and the second phase shifted output signal may be phase shifted 180°. The switched transformer phase shifter 110 may incur another split loss of 3 dB, though through use of a 180° phase shift bit, 2 dB of that 3 dB loss may be saved.

The second primary windings 216 may receive the second divided signal from the second output port 108 and inductively transmit the second divided signal to the second secondary windings 218. The second secondary windings 218 may output a third phase shifted output signal and a fourth phase shifted output signal through the third secondary windings output port 220 and the fourth secondary windings output port 222 respectively. The third phase shifted output signal may be phase shifted 270° and the fourth phase shifted output signal may be phase shifted 90°. In another implementation, the third phase shifted output signal may be phase shifted 90° and the fourth phase shifted output signal may be phase shifted 270°.

A switch 120 may be disposed in the PVM 200, in electrical communication with the first secondary windings output port 208, second secondary windings output port 210, third secondary windings output port 220, and fourth secondary windings output port 222. As mentioned prior, the switch 120 may, in response to a control signal 122 from a controller 124, selectively output one of the first, second, third, and fourth phase shifted output signals, or a combination thereof, from the PVM 200 as a vector modulated output signal 126.

The switch 120 may include coupling and/or series diodes 212, 214, 224, and 226 disposed in electrical communication with the first secondary windings output port 208, second secondary windings output port 210, third secondary windings output port 220, and the fourth secondary windings output port 222 respectively. Each of series diode 212, 214, 224, 226 may be part of a single pole double throw (SPDT) switch and/or part of a four pole or multiple pole multiple throw switch. Although not shown in FIG. 2, the signal input of each series diode 212, 214, 224, or 226 may also be coupled to a corresponding ground series diode that is biased to concurrently shunt a signal input to ground while its corresponding diode 212, 214, 224, or 226 is biased to prevent its input signal from passing through to output signal 126 (i.e., provide an open circuit with respect to output signal 126). Conversely, the signal input of each series diode 212, 214, 224, or 226 may also be coupled to a corresponding ground series diode that is concurrently biased to block a signal input from ground (i.e., provide an open circuit with respect to ground) while its corresponding diode 212, 214, 224, or 226 is biased to pass its input signal through to output signal 126. Hence, such a configuration may be considered an SPDT switch where an input signal is switched either to the output signal 126 or switched to ground. Series diodes 212, 214, 224, and 226 may serve as an on-off switch such as to selectively output one of the first, second, third, and fourth phase shifted output signals, or a combination thereof. The series diodes 212, 214, 224, 226 may be used to protect the PVM 200 from reverse polarity of the first phase shifted output signal, second phase shifted output signal, third phase shifted output signal, and fourth phase shifted output signal. Series diodes 212, 214, 224, and 226 may be connected in series with the PVM 200 to prevent reversed current. Series diodes 212, 214, 224, and 226 may include any semiconductor switch device, such as PIN diodes, FETs, BJTs, or HBTs, that includes a P-type semiconductor region, I-type (or Intrinsic) region, and a N-type semiconductor region. One advantage of a PIN diode is that forward biased resistance under certain circumstances is inversely proportional to current across the I-type region which can reduce a voltage drop and/or signal attenuation loss across the PIN diode. Other advantages include power handling for the same device sizing for the same reason, permitting large voltage swings over a shunt diode before breakdown occurs, and reverse biasing the PIN diode out of a nonlinear capacitance-voltage region. This equates to high IP2/IP3 linearity.

In one implementation, a turn ratio of about 1:0.75 may be set between the first primary windings 204 and the first secondary windings 206 to establish an impedance transformation in the first transformer balun and an output impedance of about 66.7 Ohms when the switch 120 outputs one of the first, second, third, and fourth vector modulated output signals. In one implementation, a turn ratio of about 1:0.75 may be set between the second primary windings 216 and the second secondary windings 218 to establish an output impedance of about 66.7 Ohms when the switch 120 outputs one of the first, second, third, and fourth vector modulated output signal 126 signals. In these implementations, an output impedance of about 33.3 Ohms is established when the switch outputs a combination of at least two of the first, second, third, and fourth vector modulated output signal 126. Return energy losses may range from 15-17 dB where an electrical component downstream of the PVM 200 requires an input impedance of 50 Ohms.

Figure 3:
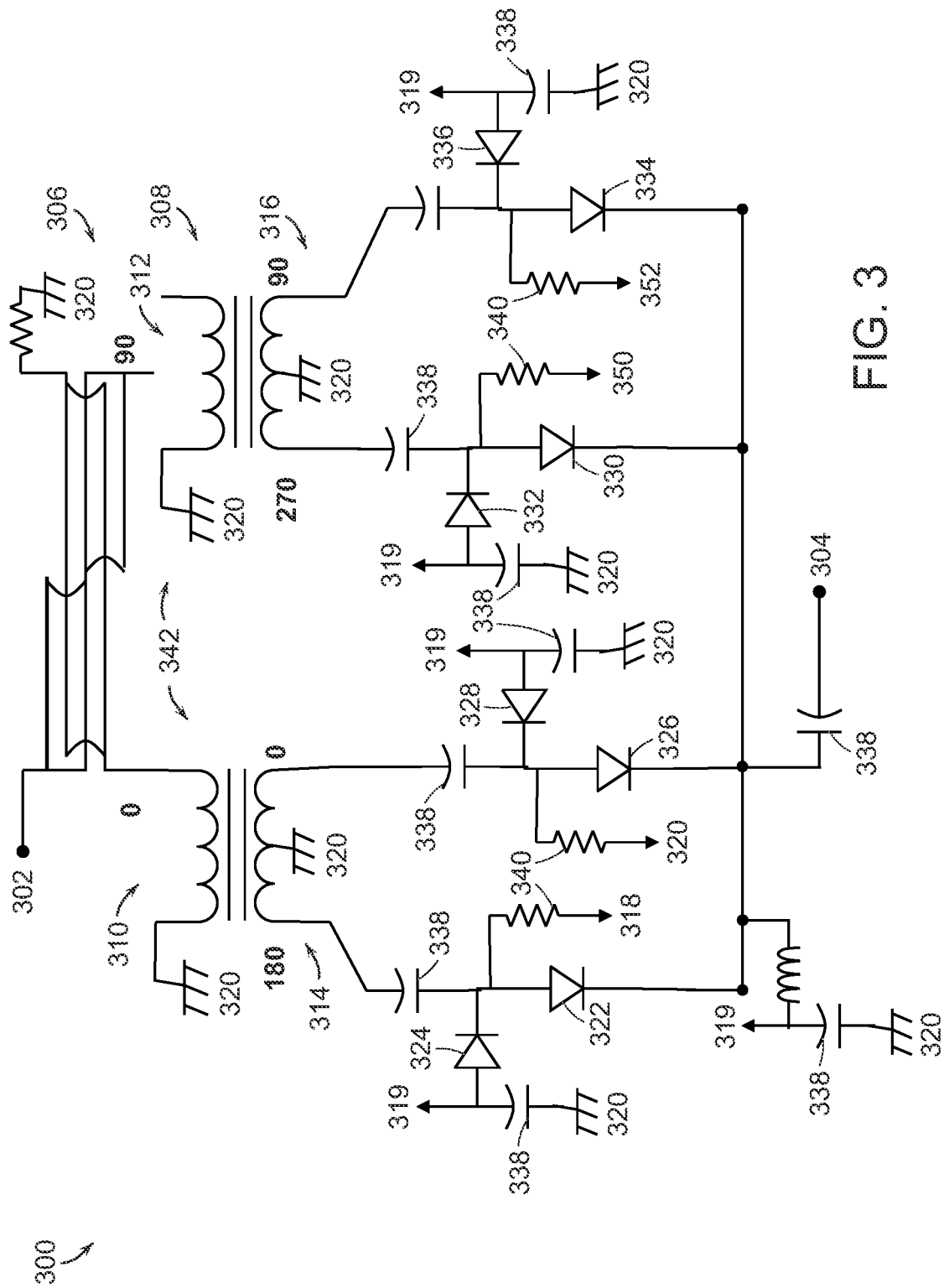
FIG. 3 is a schematic diagram of an exemplary 3-bit PVM.

FIG. 3 shows a schematic diagram of an exemplary 3-bit PVM 300. PVM 300 includes a quadrature coupler 306 coupled to transformer 342 having first primary windings 310 separated from second primary windings 312 via a center-tap to ground 320. The transformer 342 also has first secondary windings 314 and second secondary windings 316 that are each center-tapped to ground 320. PVM 300 receives an input signal at node 302 that is fed through quadrature coupler 306 to transformer 342 that outputs multiple signals at different phases including at 0° (0°), 90° (90°), 180° (180°), and 270° (270°) from secondary windings 314 and 316. The first secondary winding 314 provides signal output signals at 0° and at 180°, while second secondary winding 316 provides output signals at 90° and 270°. The combination of quadrature coupler 306 that splits the input signal at node 302 into signals at 0° and 90° phase shift, combined with transformer 342 further providing a 180° phase shift to the signals from quadrature coupler 306, results in four output signals from transformer 342 at four phases including at 0°, 90°, 180°, and 270°.

Each of the four signals at 0°/90°/180°/270° output from the secondary windings 314 and 316 are input into 4 single pole single throw (SPST) switches. The four SPST switches may be included into and/or be part of a multiple pole multiple throw (MPMT) switch. PIN diodes 322 and 324 may form part of a first SPST switch for passing through or blocking the 180° output signal from first secondary windings 314. PIN diodes 326 and 328 may form part of a second SPST switch for passing through or blocking the 0° output signal from first secondary windings 314. PIN diodes 330 and 332 may form part of a third SPST switch for passing through or blocking the 270° output signal from second secondary windings 316. PIN diodes 334 and 336 may form part of a fourth SPST switch for passing through or blocking the 90° output signal from second secondary windings 316. Various nodes 319 provide a reference voltage ($V_{ref}$) to various components of PVM 300. Various nodes 320 provide a ground voltage to various components of PVM 300. In one implementation, $V_{ref}$ is at or about 1.2 v. PVM 300 also includes various coupling capacitors 338 and biasing resisters 340. PVM 300 includes control voltage nodes 318, 320, 350, and 352. When a control voltage ($V_{on}$) is applied at node 318, PIN diode 322 is forward biased while PIN diode 324 is reversed biased. In one implementation, $V_{on}$ is at or about 2.4 v.

The forward biased PIN diode 322 passes (or shunts) the 180° signal from first secondary windings 314 through to output signal node 304. When $V_{on}$ is not applied at node 318, PIN diode 322 is reversed biased while PIN diode 324 is forward biased. PIN diode 322 blocks the 180° output signal from first secondary windings 314 from passing through to output signal node 304, while PIN diode 324 shunts the 180° output signal from first secondary windings 314 to ground 320. A similar process occurs with respect to PIN diodes 326 and 328 when $V_{on}$ is applied or not applied at node 320 to pass through or block the 0° signal from first secondary windings 314. A similar process occurs with respect to PIN diodes 330 and 332 when $V_{on}$ is applied or not applied at node 350 to pass through or block the 270° signal from second secondary windings 316. A similar process occurs with respect to PIN diodes 334 and 336 when $V_{on}$ is applied or not applied at node 352 to pass through or block the 270° signal from second secondary windings 316. By selectively applying $V_{on}$ at control nodes 318, 320, 350, and 352, the phase of the output signal of PVM 300 at output node 304 can be selectively controlled and/or set at one of eight (8) different phases including 0°, 45°, 90°, 135°, 180°, 225°, 270°, and 335° as will be described in further detail with respect to FIG. 4. The eight different output signal phases can be uniquely identified using 3-bit binary representations of 001 through 111. Hence, PVM 300 may be referred to as a 3-bit PVM.

Such a combination where quadrature coupler 306 splits the input signal into 0/90° incurs about a 3 dB split loss. Getting the other phases typically incurs another split loss of 3 dB. But in this technically advantageous configuration, PVM 300 uses a novel 180° phase shift bit to save 2 dB of that loss. Merging that phase bit with a MPMT switch enabled by a specific impedance transformation and the other 180° phase shifter, PVM 300 generates a total of the four signals from transformer 342 with greatly reduced loss and combines them seamlessly in a vector modulator configuration into an output signal in one of eight phases.

FIG. 4 shows a table 400 of the control signal settings for selectively switching the output signal phase from the 3-bit PVM of FIG. 3. The controls may also be applied to the PVMs of FIGS. 1, 2, 4, 6, and 7. Rows 402 list the control node setting that correspond to, for example, $V_{on}$ as applied to control nodes 318, 320, 350, and 352, along with $V_{ref}$ 319. Column 404 shows the $V_{on}$ settings of each of the control nodes that are set to achieve their respective phase outputs of the output signal at node 304 of PVM 300. For example, to configure PVM 300 to output a signal having a 45° phase shift, $V_{on}$ is applied to control node 320 (ps0) and control node 352 (ps 90). To configure PVM 300 to output a signal have a 315 phase shift, $V_{on}$ is applied to control node 320 (ps0) and control node 350 (ps 270). Table 400 shows that various setting of either $V_{on}$ or ground (0 v) applied to each of the nodes 318, 320, 350, and 352 to generate one of the eight output phases 0°, 45°, 90°, 135°, 180°, 225°, 270°, and 335°. In one implementation, $V_{on}$ is set to 2.4 volts (v) whereas $V_{rev}$ is set to 1.2 volts.

Figure 5A:
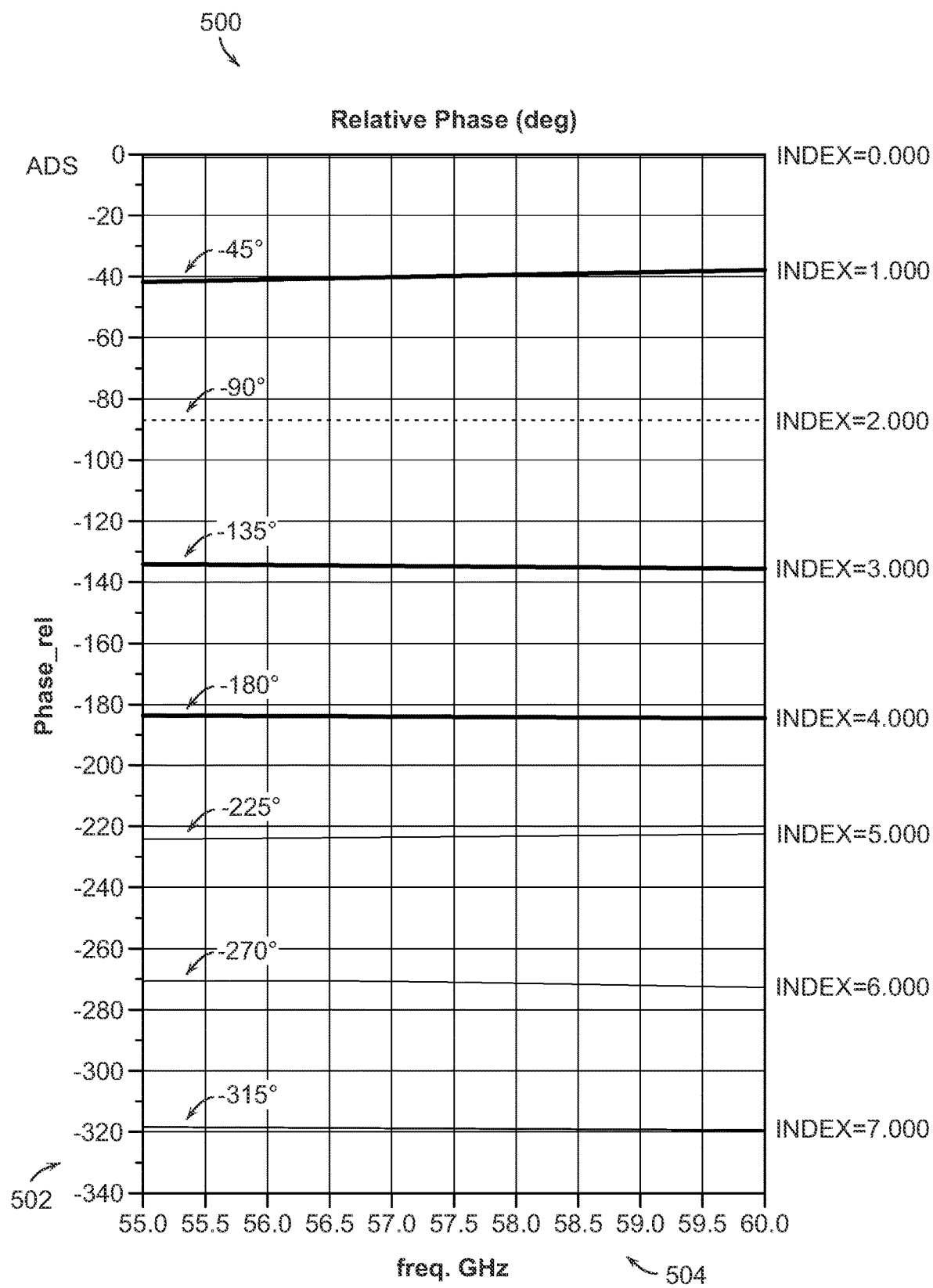
FIG. 5A shows a plot of phase vs. frequency for a PVM such as the PVM of FIGS. 1, 2, and 3.

FIG. 5A shows a plot 500 of phase 502 vs. frequency 504 for a PVM such as PVMs 200 and 300 of FIGS. 1, 2, and 3. FIG. 5A illustrates how relatively stable the phase shift of PVMs 200 and 300 are over a ranged of 55-60 GHz.

Figure 5B:
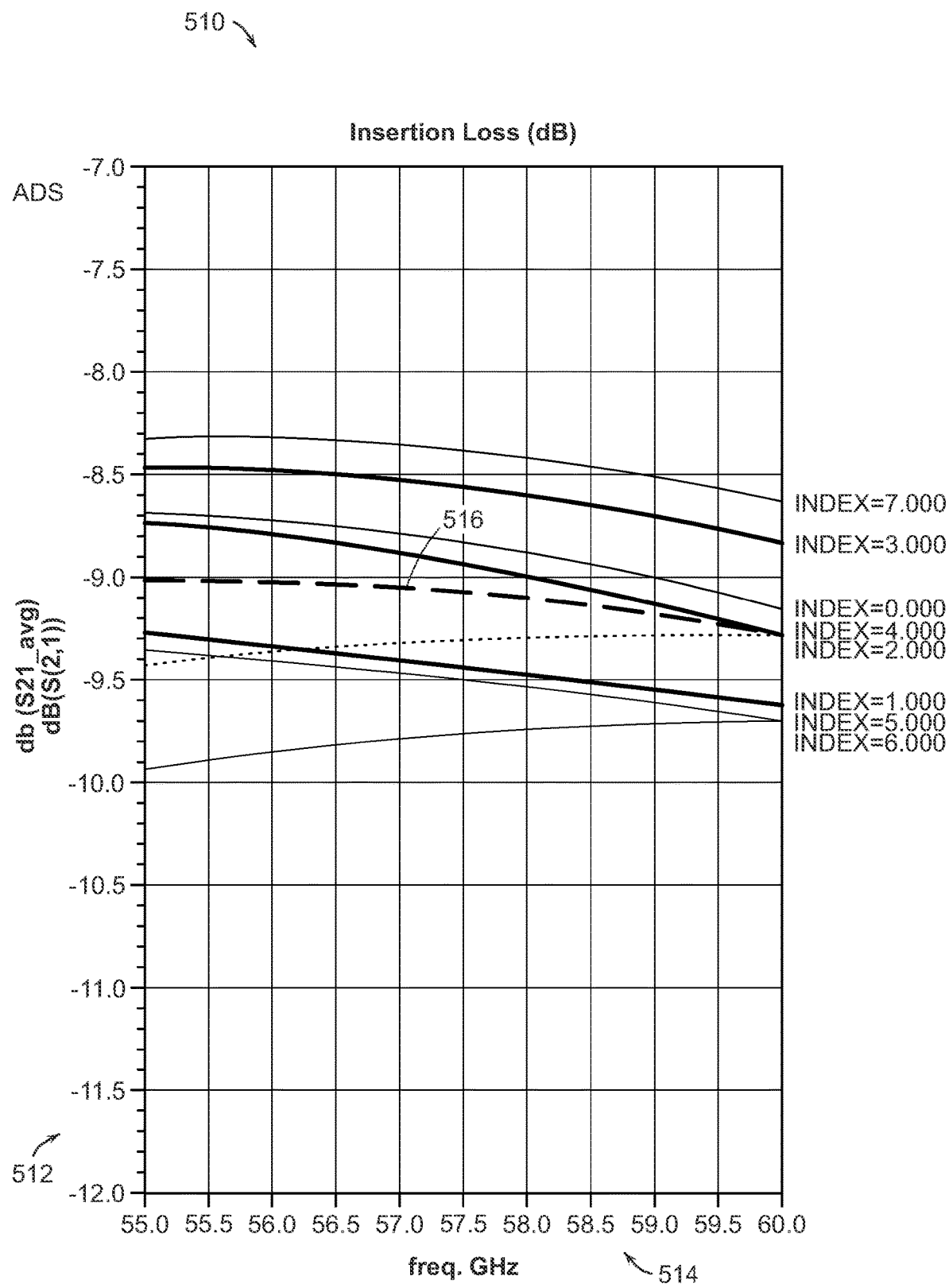
FIG. 5B shows a plot of signal insertion loss vs. frequency for a PVM such as the PVM of 1, 2, and 3.

FIG. 5B shows a plot 510 of signal insertion loss 512 vs. frequency 514 for a PVM such as PVMs 100, 200, and 300 of FIGS. 1, 2, and 3. FIG. 5B illustrates how an average insertion of 516 remains below about 9.3 dB over a range of 55-60 GHz.

Figure 5C:
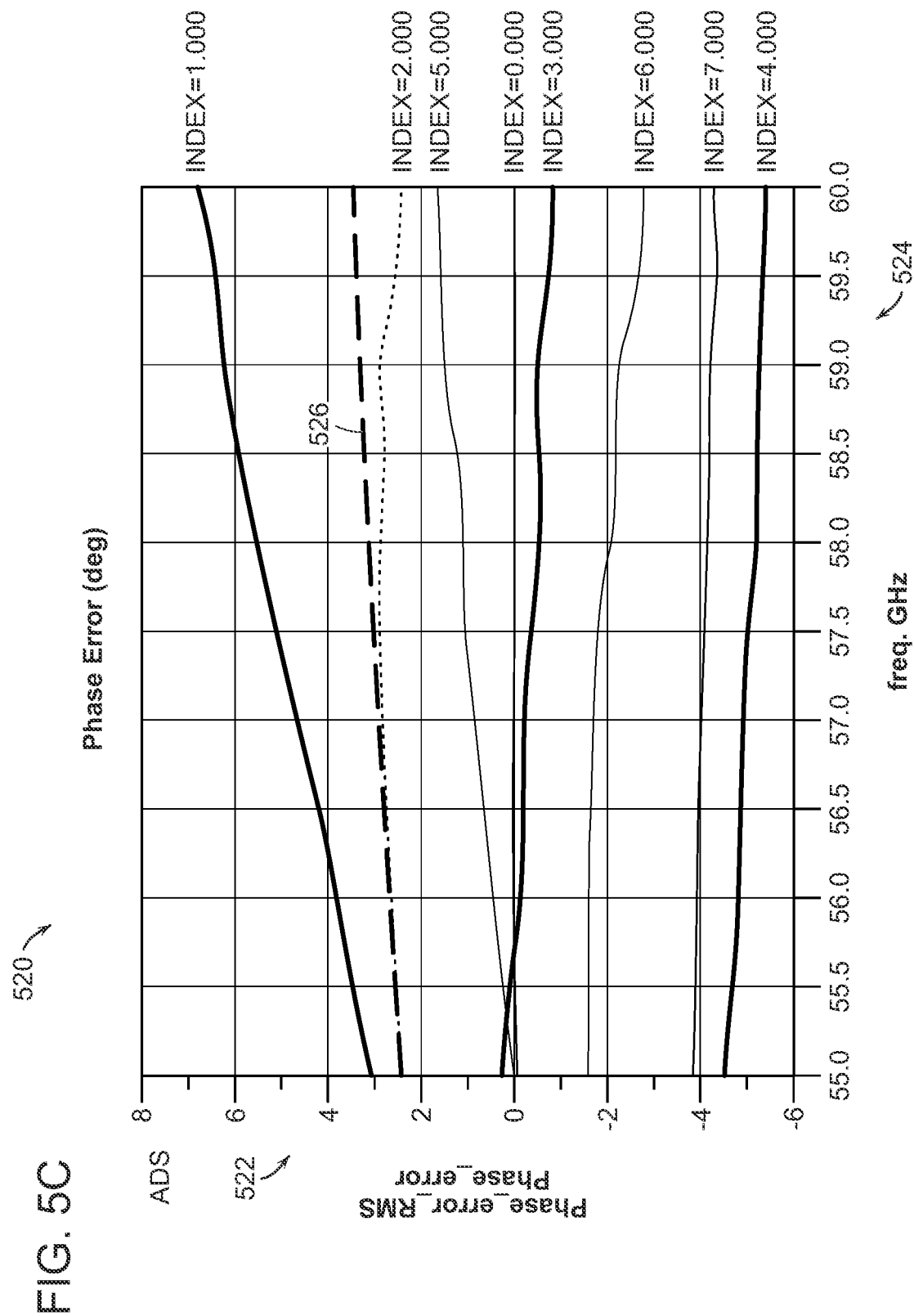
FIG. 5C shows a plot of phase error vs. frequency for a PVM such as the PVM of FIGS. 1, 2, and 3.

FIG. 5C shows a plot 520 of phase error 522 vs. frequency 524 for a PVM such as PVMs 100, 200, and 300 of FIGS. 1, 2, and 3. FIG. 5C illustrates how an average phase error 526 remains below about 4° RMS over a range of 55-60 GHz.

Figure 5D:
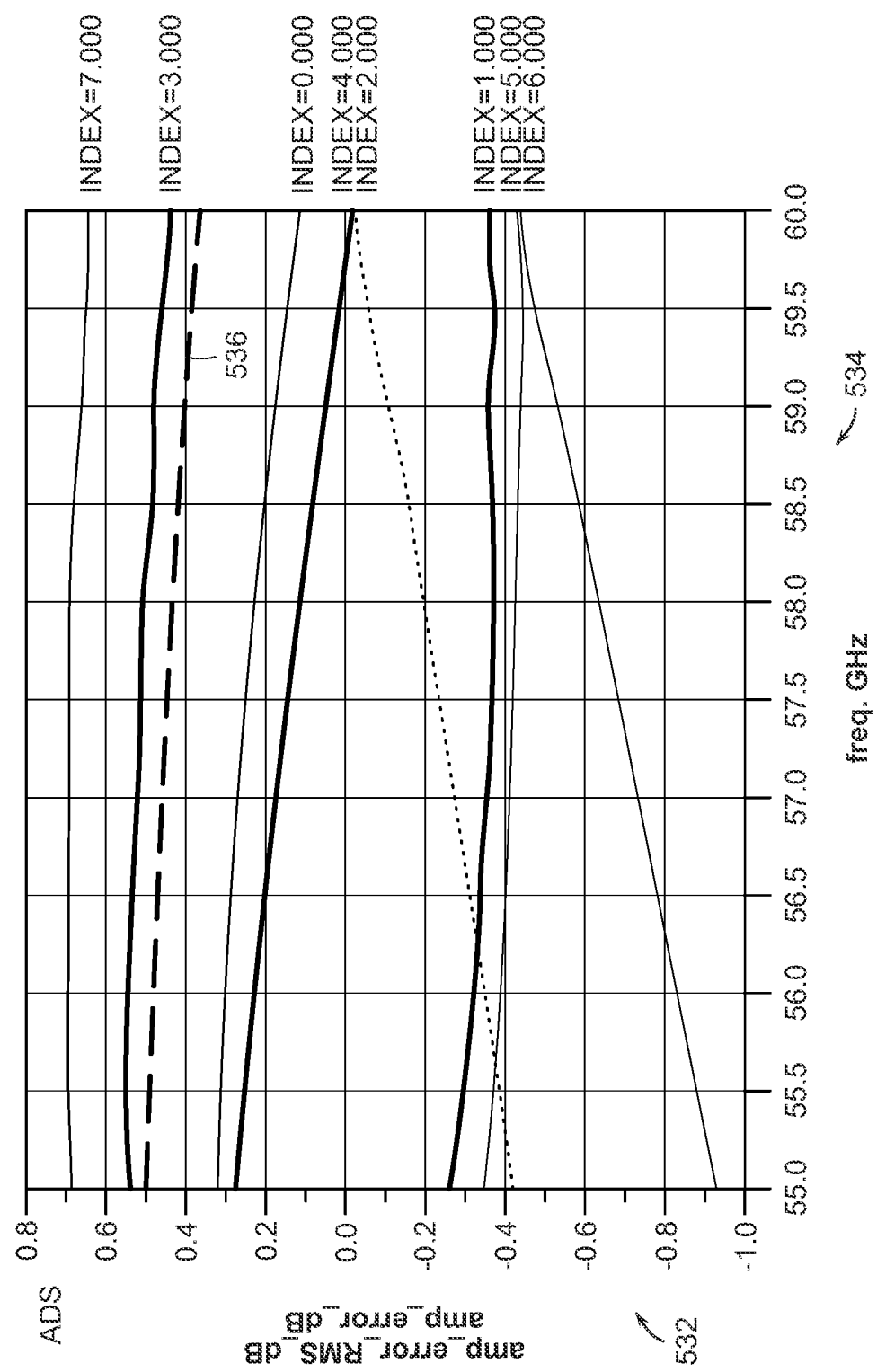
FIG. 5D shows a plot of amplitude error vs. frequency for a PVM such as the PVM of FIGS. 1, 2, and 3.

FIG. 5D shows a plot 530 of amplitude error 532 vs. frequency 534 for a PVM such as PVMs 100, 200, and 300 of FIGS. 1, 2, and 3. FIG. 5D illustrates how an average amplitude error 536 remains below about 0.5 dB over a range of 55-60 GHz.

Figure 5E:
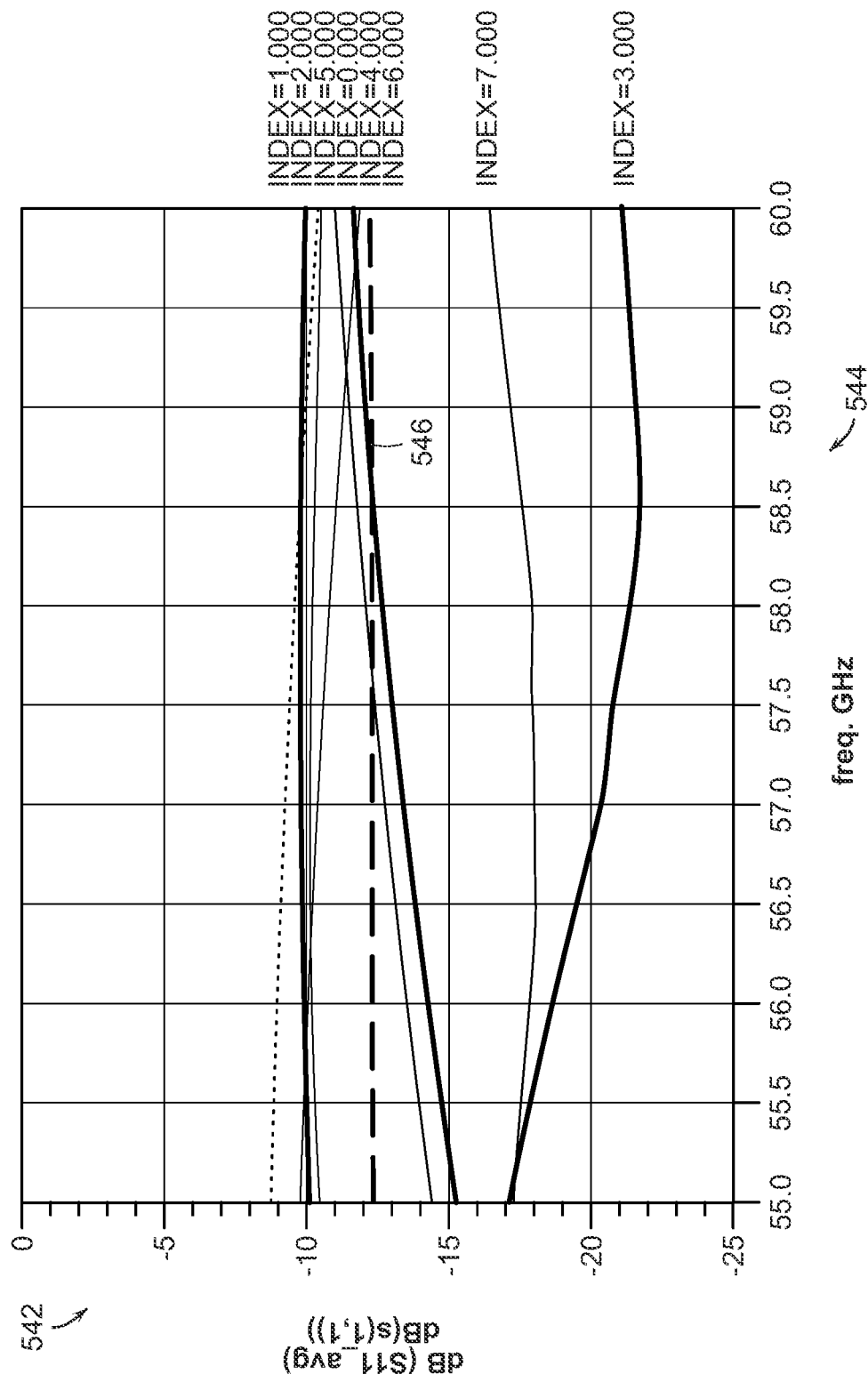
FIG. 5E shows a plot of input signal return loss vs. frequency for a PVM such as the PVM of FIGS. 1, 2, and 3.

FIG. 5E shows a plot 540 of input signal return loss 542 vs. frequency 544 for a PVM such as PVMs 100, 200, and 300 of FIGS. 1, 2, and 3. FIG. 5E illustrates how an average input signal loss remains below about 13 dB over a range of 55-60 GHz.

Figure 5F:
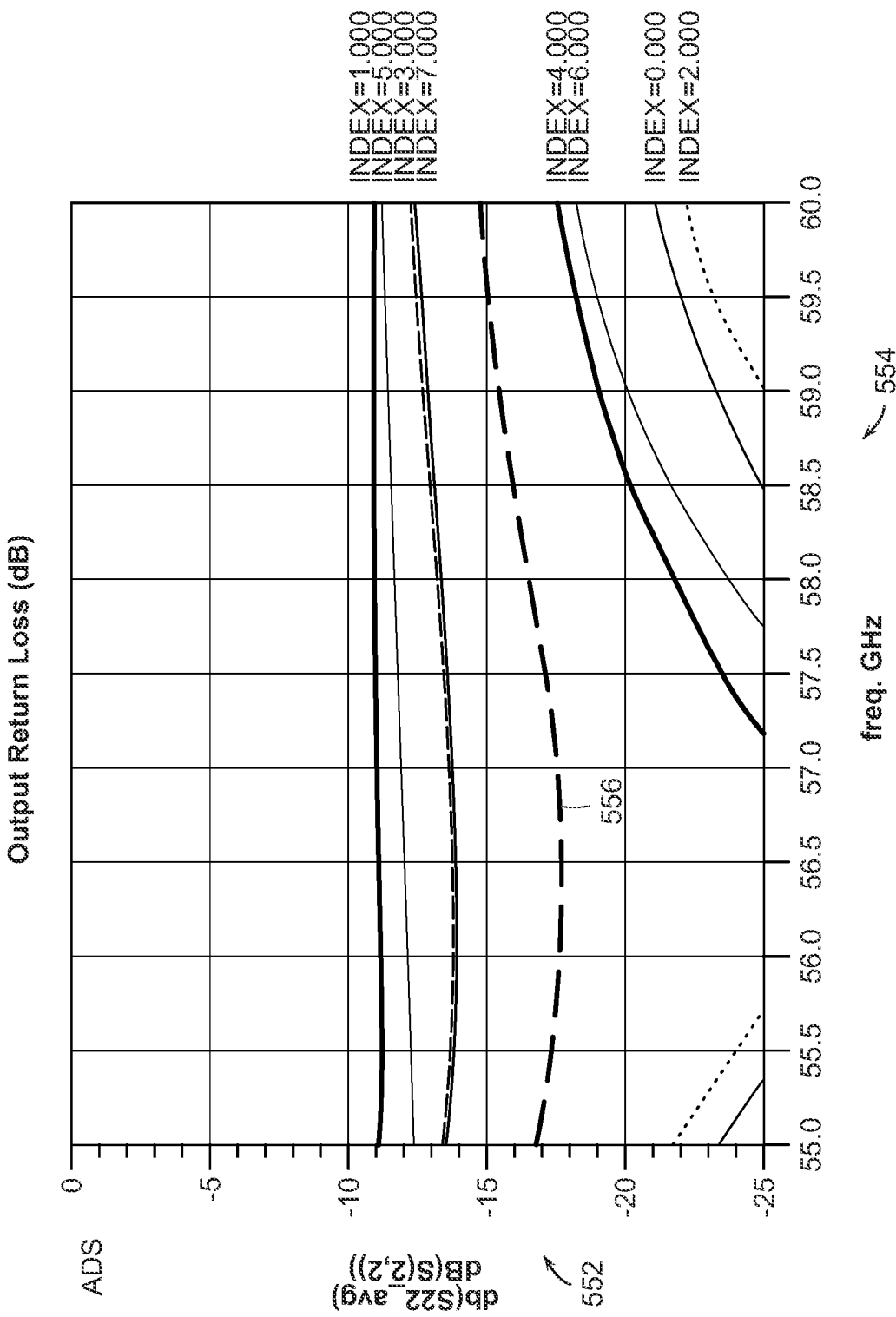
FIG. 5F shows a plot of output signal return loss vs. frequency for a PVM such as the PVM of FIGS. 1, 2, and 3.

FIG. 5F shows a plot 550 of output signal return loss 552 vs. frequency 554 for a PVM such the PVMs 100, 200, and 300 of FIGS. 1, 2, and 3. FIG. 5F illustrates how an average output signal return loss 556 remains below about 15 dB over a range of 55-60 GHz.

Figure 6:
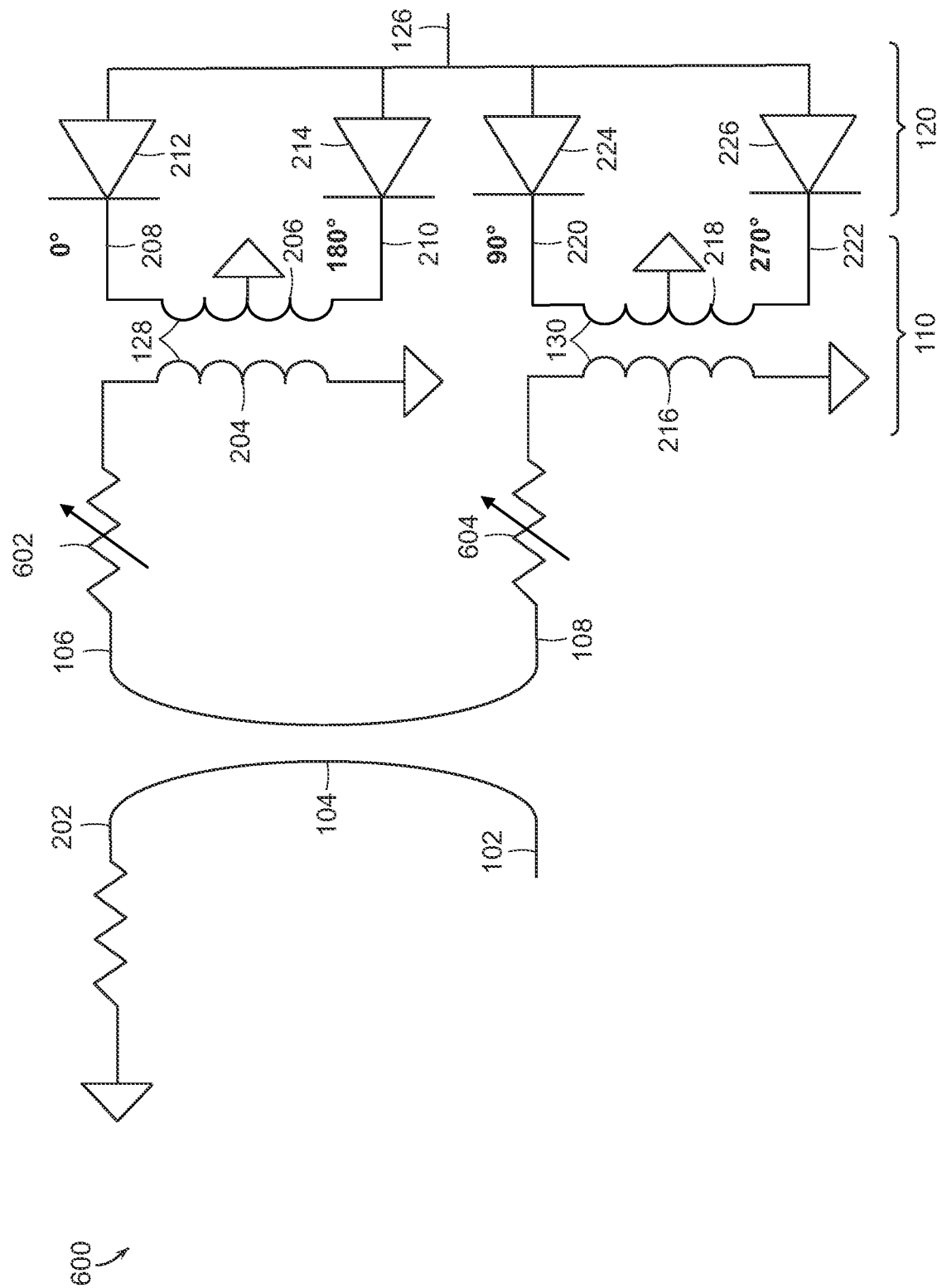
FIG. 6 is a simplified schematic of a PVM with attenuators.

FIG. 6 is a simplified schematic of a PVM 600 with attenuators 602, 604. The PVM 600 may receive an input signal through the input port 102 of the power divider 104. The power divider 104 may split the input signal equally between the first output port 106 and second output port 108. The first divided signal may travel through the first output port 106 and the second divided signal may travel through the second output port 108 with a 90° phase difference between them.

The first output port 106 may be in electrical communication with a first attenuator 602 and the second output port 108 may be in electrical communication with a second attenuator 604. The first attenuator 602 and second attenuator 604 may be included in PVM 600 to reduce the power of the first divided signal or second divided signal respectively without appreciably distorting the signal waveform. As such, the first attenuator 602 and the second attenuator 604 may add a calibrated amount of signal loss to the first divided signal or second divided signal respectively to properly match transmitter or receiver levels disposed upstream or downstream of the PVM 600. The first attenuator 602 and the second attenuator 604 may add additional phase bits to the first divided signal or second divided signal respectively. The calibrated amount of signal loss to the first divided signal or second divided signal together or separate may be on the order of 4 dB, though more attenuation may provide more phase bits.

The first attenuator 602 may be in electrical communication with the first primary windings 204 of the switched transformer phase shifter 110. The second attenuator 602 may be in electrical communication with the second primary windings 204 of the switched transformer phase shifter 110.

As such, the input signal may be split by the power divider 104 into a first divided signal and a second divided signal that are 90° apart in phase. The first attenuator 602 may thereafter receive the first divided signal from the first output port 106 and transmit the first divided signal to the first primary windings 204. When the first divided signal is received by the first primary windings 204, it may have obtained additional phase bits at the cost of energy loss on the order of 2-4 dB as compared to the first divided signal in PVM 200. The second attenuator 604 may thereafter receive the first divided signal from the second output port 108 and transmit the second divided signal to the second primary windings 216. When the second divided signal is received by the second primary windings 216, it may have obtained additional phase bits at the cost of energy loss on the order of 4 dB as compared to the second divided signal in PVM 200. In this implementation, more attenuation may provide more phase bits. PVM 600 may thereafter operate in a similar manner as PVM 200 as described herein.

Elements, equations, or steps of different implementations described may be combined to form other implementations not specifically set forth previously. Elements, equations, or steps may be left out of the lasers or processes described previously without adversely affecting their operation or the operation of the laser in general. Furthermore, various separate elements, equations, or steps may be combined into one or more individual elements or steps to perform the functions described in this specification. It should be understood by one skilled in the art that equations set forth herein may be otherwise expressed in a different form or manner with different underlying assumptions, thus not specifically set forth.

Other implementations not specifically described in this specification are also within the scope of the following claims.

What is claimed is:

1. A passive vector modulator comprising:
   a power divider that splits an input signal into a first divided signal and a second divided signal, the first divided signal and second divided signal being 90° apart in phase; and
   a switched transformer phase shifter in electrical communication with the power divider, including:
   primary windings being center-tapped to form first primary windings and second primary windings, the first primary windings receiving the first divided signal, the second primary windings receiving the second divided signal;
   first secondary windings being inductively coupled to the first primary windings, the first secondary windings being center-tapped and outputting first and second phase shifted output signals, the first phase shifted output signal being phase shifted 180° and the second phase shifted output signal being phase shifted 0°;
   second secondary windings being inductively coupled to the second primary windings, the second secondary ary windings being center-tapped and outputting third and fourth phase shifted signals, the third phase shifted output signal being phase shifted 270° and the fourth phase shifted output signal being phase shifted 90°; and a switch configured to receive the first, second, third, and fourth phase shifted output signals, the switch, in response to a control signal, selectively outputting one of the first, second, third, and fourth phase shifted output signals, or a combination thereof, from the passive vector modulator as a vector modulated output signal.

2. The passive vector modulator of claim 1, wherein the power divider includes a quadrature coupler.

3. The passive vector modulator of claim 1, wherein the switched transformer phase shifter includes at least one balun transformer.

4. The passive vector modulator of claim 3, wherein the first secondary windings form a first transformer balun and the second secondary windings form a second transformer balun.

5. The passive vector modulator of claim 4, wherein a turn ratio of about 1:0.75 is set between the first primary windings and the first secondary windings to establish an output impedance of about 66.7 Ohms and wherein a turn ratio of about 1:0.75 is set between the second primary windings and the second secondary windings to establish an output impedance of about 66.7 Ohms when the switch outputs one of the first, second, third, and fourth output signals.

6. The passive vector modulator of claim 5, wherein an output impedance of about 33.3 Ohms is established when the switch outputs a combination of at least two of the first, second, third, and fourth output signals.

7. The passive vector modulator of claim 1, wherein a turn ratio of X:Y is set between the first primary windings and the first secondary windings and wherein a turn ratio of X:Y is set between the second primary windings and the second secondary windings, wherein X and Y are not equal.

8. The passive vector modulator of claim 1, further comprising first attenuator and second attenuators disposed between the power divider and the first primary windings and second primary windings respectively.

9. The passive vector modulator of claim 1, wherein the switched transformer phase shifter includes a first transformer phase shifter and a second transformer phase shifter, wherein the first transformer phase shifter includes the first primary windings and first secondary windings, and the second transformer phase shifter includes the second primary windings and second secondary windings.

10. The passive vector modulator of claim 1, wherein the switch includes one or more series diodes.

11. A method of modulating a signal comprising:
splitting an input signal into a first divided signal and a second divided signal, the first divided signal and second divided signal being 90° apart in phase;
receiving the first divided signal with first primary windings of center-tapped primary windings;
receiving the second divided signal with second primary windings of the center-tapped primary windings;
transmitting first and second phase shifted output signals with first secondary windings, the first secondary windings being inductively coupled to the first primary windings, the first phase shifted output signal being phase shifted 180° and the second phase shifted output signal being phase shifted 0°;
transmitting third and fourth phase shifted output signals with second secondary windings, the second secondary windings being inductively coupled to the second primary windings, the third phase shifted output signal being phase shifted 270° and the fourth phase shifted output signal being phase shifted 90°;
selectively outputting one of the first, second, third, and fourth output signals, or a combination thereof, as a vector modulated output signal in response to a control signal with a switch configured to receive the first, second, third, and fourth phase shifted output signals.

12. The method of claim 11, wherein splitting an input signal into a first divided signal and a second divided signal is completed by a quadrature coupler.

13. The method of claim 11, wherein the first secondary windings form a first transformer balun and the second secondary windings form a second transformer balun.

14. The method of claim 13, further comprising setting a turn ratio of about 1:0.75 between the first primary windings and the first secondary windings to establish an output impedance of about 66.7 Ohms, and setting a turn ratio of about 1:0.75 between the second primary windings and the second secondary windings to establish an output impedance of about 66.7 Ohms when the switch outputs one of the first, second, third, and fourth output signals.

15. The method of claim 14, wherein an output impedance of about 33.3 Ohms is established when the switch outputs a combination of at least two of the first, second, third, and fourth output signals.

16. The method of claim 11, further comprising setting a turn ratio of X:Y between the first primary windings and the first secondary windings, and setting a turn ratio between the second primary windings and the second secondary windings of X:Y, wherein X and Y are not equal.

17. The method of claim 11, further comprising providing additional phase bits using a first attenuator and second attenuator disposed between the power divider and the first phase shifter and second phase shifter respectively.

18. The method of claim 11, wherein the first primary windings and first secondary windings are disposed within a first transformer phase shifter, and the second primary windings and second secondary windings are disposed within a second transformer phase shifter.

19. The method of claim 11, wherein selectively outputting one of the first, second, third, and fourth output signals is completed by a switch.

20. A transceiver comprising:
an antenna; and
a passive vector modulator comprising:
a power divider that splits an input signal into a first divided signal and a second divided signal, the first divided signal and second divided signal being 90° apart in phase; and
a switched transformer phase shifter, in electrical communication with the power divider, including:
primary windings being center-tapped to form first primary windings and second primary windings, the first primary windings receiving the first divided signal, the second primary windings receiving the second divided signal;
first secondary windings being inductively coupled to the first primary windings, the first secondary windings being center-tapped and outputting first and second phase shifted output signals, the first phase shifted output signal being phase shifted 180° and the second phase shifted output signal being phase shifted 0°;
second secondary windings being inductively coupled to the second primary windings, the second secondary windings being center-tapped and outputting third and fourth phase shifted signals, the third phase shifted output signal being phase shifted 270° and the fourth phase shifted output signal being phase shifted 90°; and a switch configured to receive the first, second, third, and fourth phase shifted output signals, the switch, in response to a control signal, selectively outputting one of the first, second, third, and fourth phase shifted output signals, or a combination thereof, from the passive vector modulator as a vector modulated output signal.

\* \* \* \* \*